(12) United States Patent
Kim et al.

(10) Patent No.: US 10,971,454 B2
(45) Date of Patent: Apr. 6, 2021

(54) SEMICONDUCTOR PACKAGE

(71) Applicant: SAMSUNG ELECTRO-MECHANICS CO., LTD., Suwon-si (KR)

(72) Inventors: Jong Rok Kim, Suwon-si (KR); Young Sik Hur, Suwon-si (KR); Young Kwan Lee, Suwon-si (KR); Jung Hyun Cho, Suwon-si (KR); Seung Eun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 6 days.

(21) Appl. No.: 16/521,271

(22) Filed: Jul. 24, 2019

(65) Prior Publication Data

US 2020/0328160 A1 Oct. 15, 2020

(30) Foreign Application Priority Data

Apr. 12, 2019 (KR) .................. 10-2019-0043219

(51) Int. Cl.
*H01L 23/538* (2006.01)
*H01L 23/495* (2006.01)
(Continued)

(52) U.S. Cl.
CPC .......... *H01L 23/5389* (2013.01); *H01L 21/56* (2013.01); *H01L 23/3128* (2013.01);
(Continued)

(58) Field of Classification Search
CPC ................. H01L 23/5389; H01L 24/09; H01L 23/49816; H01L 25/0657; H01L 23/5226;
(Continued)

(56) References Cited

U.S. PATENT DOCUMENTS

2014/0027889 A1* 1/2014 Boone ................. H01L 23/5389
257/668
2016/0276307 A1* 9/2016 Lin ........................ H01L 23/552
(Continued)

FOREIGN PATENT DOCUMENTS

KR 10-2018-0073371 A 7/2018

*Primary Examiner* — Edward Chin
(74) *Attorney, Agent, or Firm* — Morgan, Lewis & Bockius LLP

(57) ABSTRACT

A semiconductor package includes: a core structure having first and second surfaces and having first and second through-holes; a first semiconductor chip embedded in the core structure and having first and second contacts disposed on two opposing surfaces thereof, respectively; a first wiring layer on the surface of the core structure and connected to the first contact; a second wiring layer on the second surface of the core structure and connected to the second contact; a chip antenna disposed in the first through-hole; a second semiconductor chip in the second through-hole and having a connection pad; a first redistribution layer on the first surface of the core structure and connected to the connection terminal, the connection pad, and the first wiring layer; an encapsulant encapsulating the chip antenna and the second semiconductor chip; and a second redistribution layer on the encapsulant connecting to the second wiring layer.

19 Claims, 13 Drawing Sheets

(51) Int. Cl.
| | |
|---|---|
| *H01L 23/498* | (2006.01) |
| *H01L 23/50* | (2006.01) |
| *H01L 21/56* | (2006.01) |
| *H01L 25/065* | (2006.01) |
| *H01L 23/31* | (2006.01) |
| *H01L 23/522* | (2006.01) |
| *H01L 23/00* | (2006.01) |

(52) U.S. Cl.
CPC .. *H01L 23/49503* (2013.01); *H01L 23/49816* (2013.01); *H01L 23/50* (2013.01); *H01L 23/5226* (2013.01); *H01L 24/06* (2013.01); *H01L 24/09* (2013.01); *H01L 24/12* (2013.01); *H01L 24/48* (2013.01); *H01L 25/0657* (2013.01); *H01L 2224/04105* (2013.01); *H01L 2224/05008* (2013.01); *H01L 2224/12105* (2013.01); *H01L 2924/1432* (2013.01); *H01L 2924/1433* (2013.01); *H01L 2924/15172* (2013.01); *H01L 2924/15182* (2013.01)

(58) Field of Classification Search
CPC ... H01L 23/50; H01L 23/49503; H01L 24/12; H01L 24/48; H01L 21/56; H01L 24/06; H01L 23/3128; H01L 2224/04105; H01L 2924/15182; H01L 2224/12105; H01L 2224/05008; H01L 2924/1432; H01L 2924/1433; H01L 2924/15172
See application file for complete search history.

(56) References Cited

U.S. PATENT DOCUMENTS

| | | | |
|---|---|---|---|
| 2018/0182691 A1* | 6/2018 | Cho | H01L 24/20 |
| 2020/0185815 A1* | 6/2020 | Lee | H01Q 21/065 |

* cited by examiner

SEMICONDUCTOR PACKAGE

CROSS-REFERENCE TO RELATED APPLICATIONS

This application claims the benefit of priority to Korean Patent Application No. 10-2019-0043219 filed on Apr. 12, 2019 in the Korean Intellectual Property Office, the disclosure of which is incorporated herein by reference in its entirety.

TECHNICAL FIELD

The present disclosure relates to a semiconductor package.

BACKGROUND

One important factor to consider when designing modules of various forms, such as in smartphones and various automotive components, pertains to integrating various components serving various functions (for example, integrated circuit chips, sensors, passive components, etc.) while reducing the sizes thereof.

Since components including various semiconductor chips are typically unable to afford sufficient mounting space inside a single module, when such components are connected to the surface of a mainboard, it may be difficult to miniaturize modules, while an electrical loss is likely to arise due to extended signal paths between the components. Particularly, semiconductor chips, such as power IC chips that require double-sided connection circuit for connecting contacts disposed on opposing surfaces of the chips, tend to require complicated electrical connections, thus creating an immense challenge to miniaturize package structures.

SUMMARY

An aspect of the present disclosure is to provide a semiconductor package having a structure suitable for components in various forms, including semiconductor chips requiring double-sided connection circuit for connecting contacts disposed on opposing surfaces of the semiconductor chips.

According to an aspect of the present disclosure, a semiconductor package includes: a core structure having a frame having a cavity penetrating first and second surfaces of the frame opposing each other, a wiring structure penetrating the frame to connect the first and second surfaces to each other, a first semiconductor chip disposed in the cavity and having a first surface having a first contact and a second surface opposing the first surface of the first semiconductor chip and having a second contact, a first encapsulant encapsulating the first semiconductor chip and disposed on the first and second surfaces of the frame, and a through-hole penetrating portions of the first encapsulant and the frame, the core structure having first and second surfaces corresponding to the first and second surfaces of the frame, respectively; a first wiring layer disposed on the first surface of the core structure and penetrating the first encapsulant to connect to the first contact of the first semiconductor chip; a second wiring layer disposed on the second surface of the core structure and penetrating the first encapsulant to connect to the second contact of the first semiconductor chip; a chip component disposed in the through-hole of the core structure and having a connection terminal; a first redistribution layer disposed on the first surface of the core structure and connected to the connection terminal of the chip component and to the first wiring layer; a second encapsulant encapsulating the chip component and disposed on the second surface of the core structure; and a second redistribution layer disposed on the second encapsulant and penetrating the second encapsulant to connect to the second wiring layer.

According to another aspect of the present disclosure, a semiconductor package includes: a core structure having first and second surfaces opposing each other, and having first and second through-holes; a first semiconductor chip embedded in the core structure and having first and second contacts disposed on two opposing surfaces; a first wiring layer disposed on the first surface of the core structure and connected to the first contact of the first semiconductor chip; a second wiring layer disposed on the second surface of the core structure and connected to the second contact of the first semiconductor chip; a chip antenna disposed in the first through-hole of the core structure and having a connection terminal; a second semiconductor chip disposed in the second through-hole of the core structure and having a connection pad; a first redistribution layer disposed on the first surface of the core structure and connected to the connection terminal, the connection pad, and the first wiring layer; an encapsulant encapsulating the chip antenna and the second semiconductor chip, and disposed on the second surface of the core structure; and a second redistribution layer disposed on the encapsulant and penetrating the encapsulant to connect the second wiring layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. In the accompanying drawings, shapes, sizes, and the like, of components may be exaggerated or simplified for clarity.

Electronic Device

Figure 1:
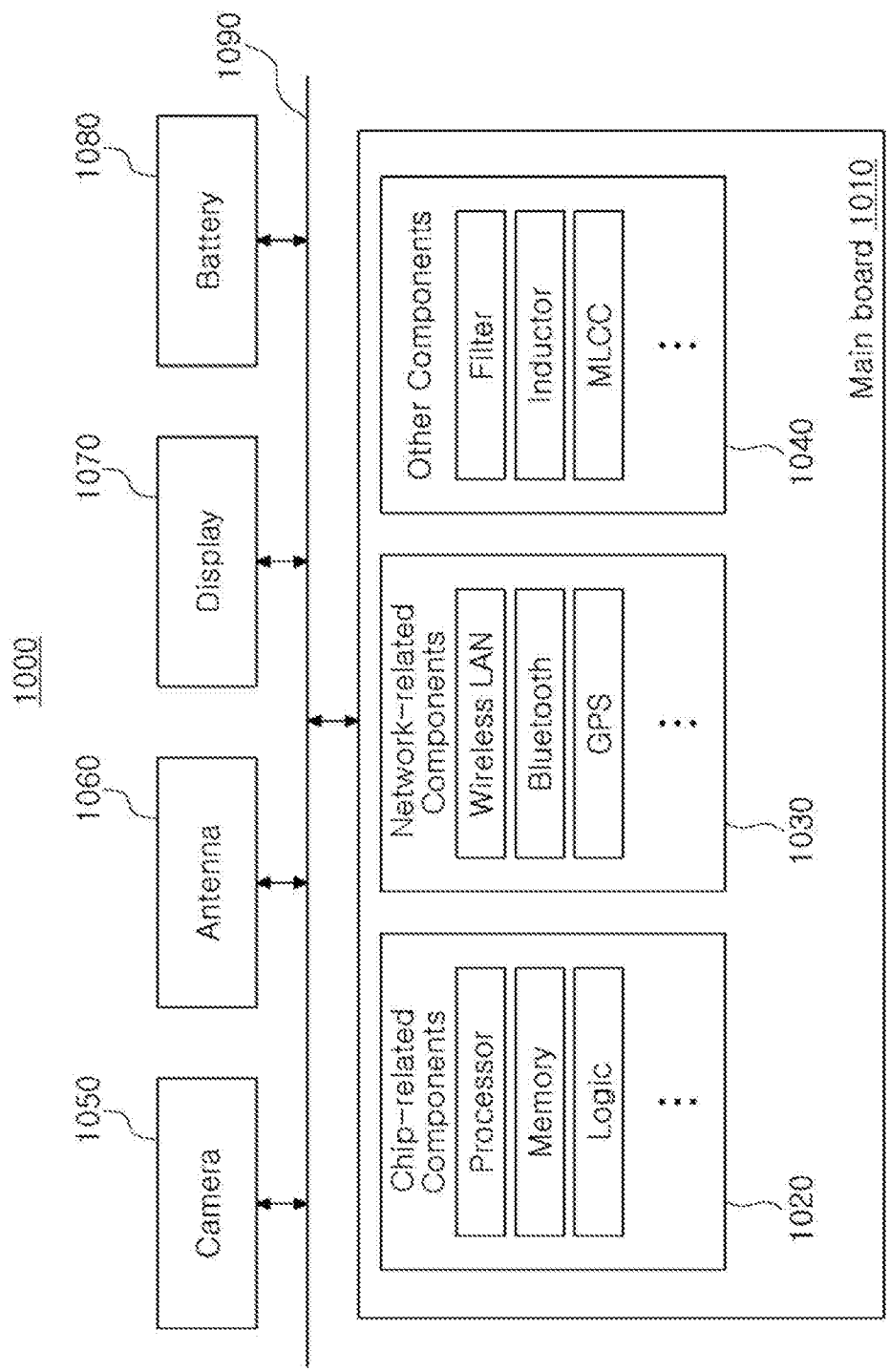
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to other components, to be described below, to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto and may also include other types of chip-related components. In addition, the chip-related components 1020 may be combined with each other.

The network-related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
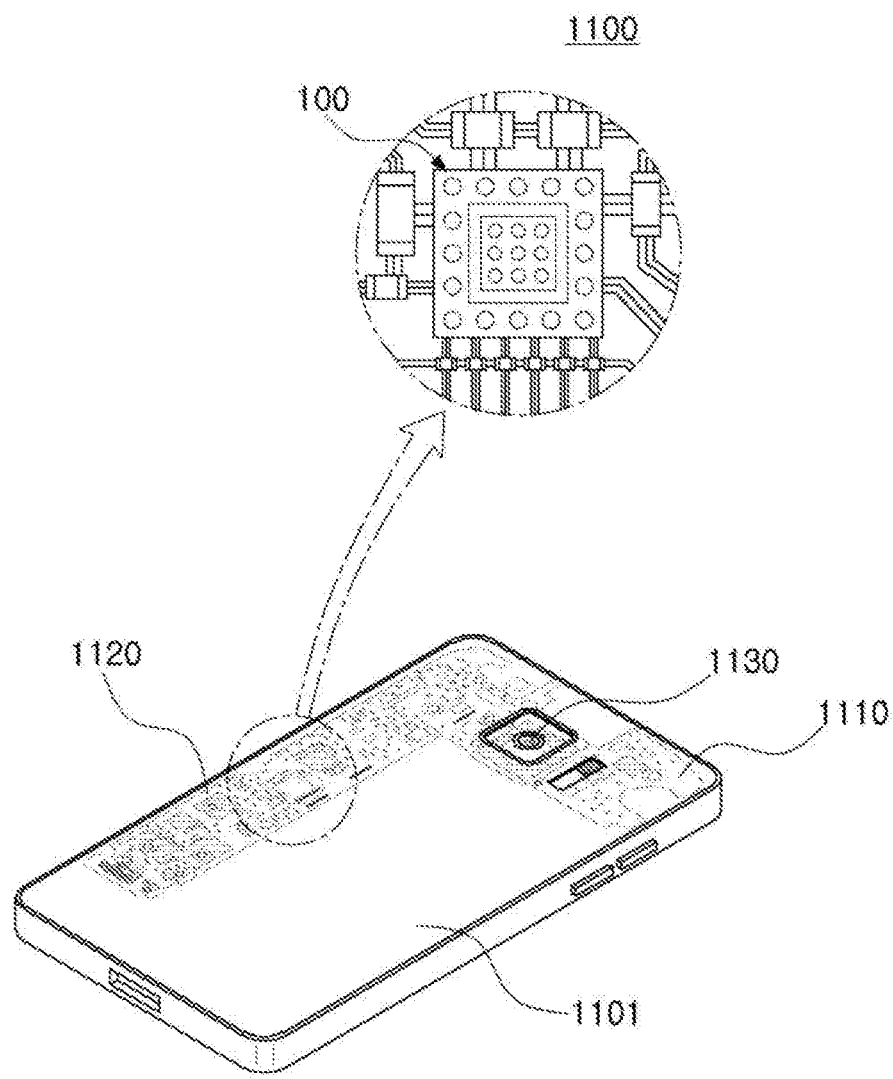
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100 but may be other electronic devices as described above.

Semiconductor Package

Generally, numerous fine electrical circuits are integrated in a semiconductor chip. However, the semiconductor chip may not serve as a semiconductor finished product in itself and may be damaged due to external physical or chemical impact. Therefore, the semiconductor chip may not be used by itself, but is instead packaged and used in an electronic device or the like in a package state.

Semiconductor packaging is commonly used because there usually is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and the use of packaging technology for buffering a difference in a circuit width between the semiconductor and the mainboard is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
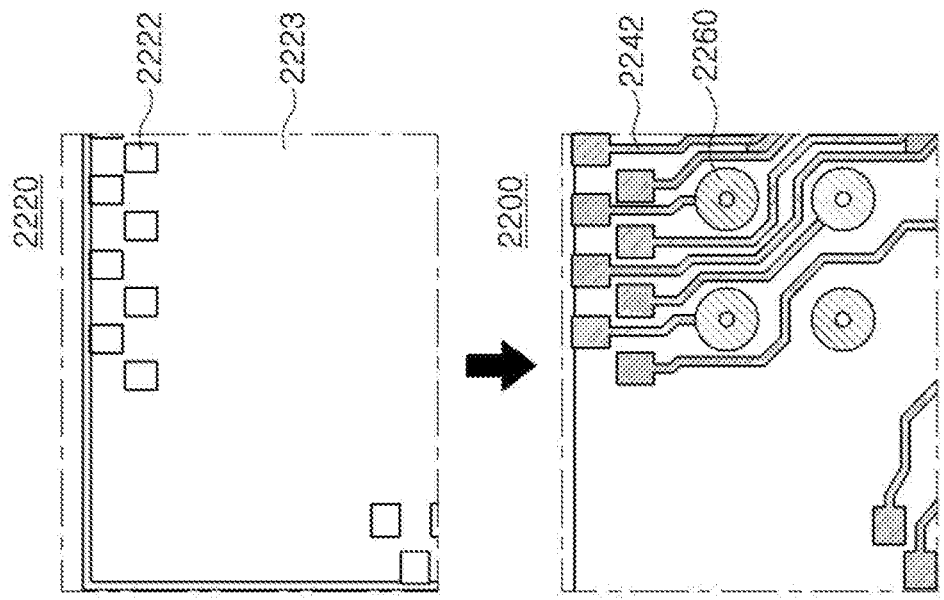
FIGS. 3A and 3B are schematic cross-sectional views illustrating a fan-in semiconductor package before and after being packaged.
Figure 3A:
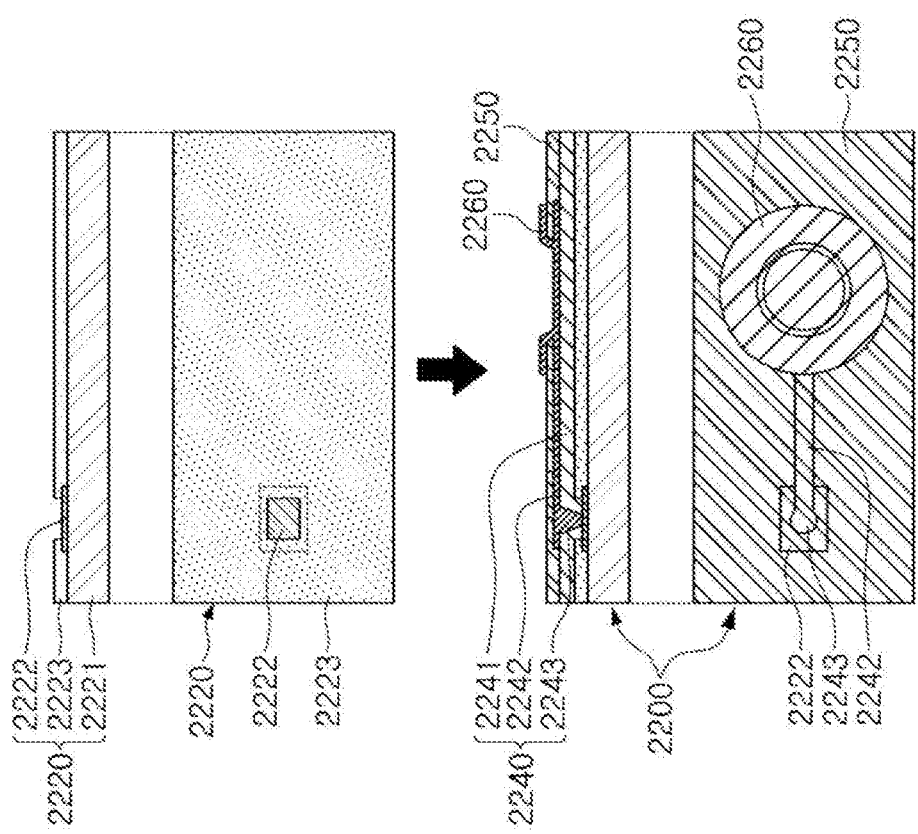
Figure 4:
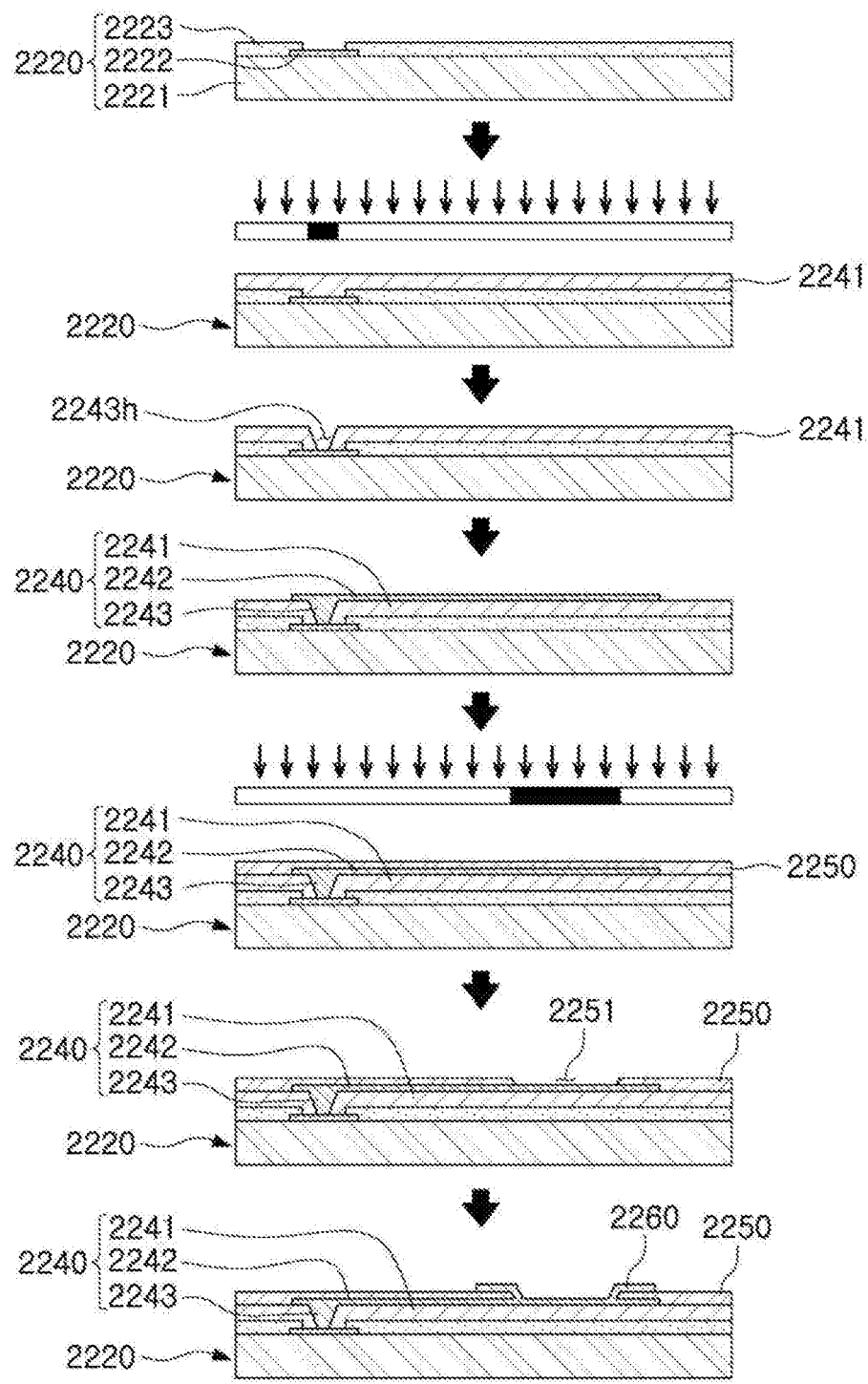
FIG. 4 shows a series of schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the mainboard of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
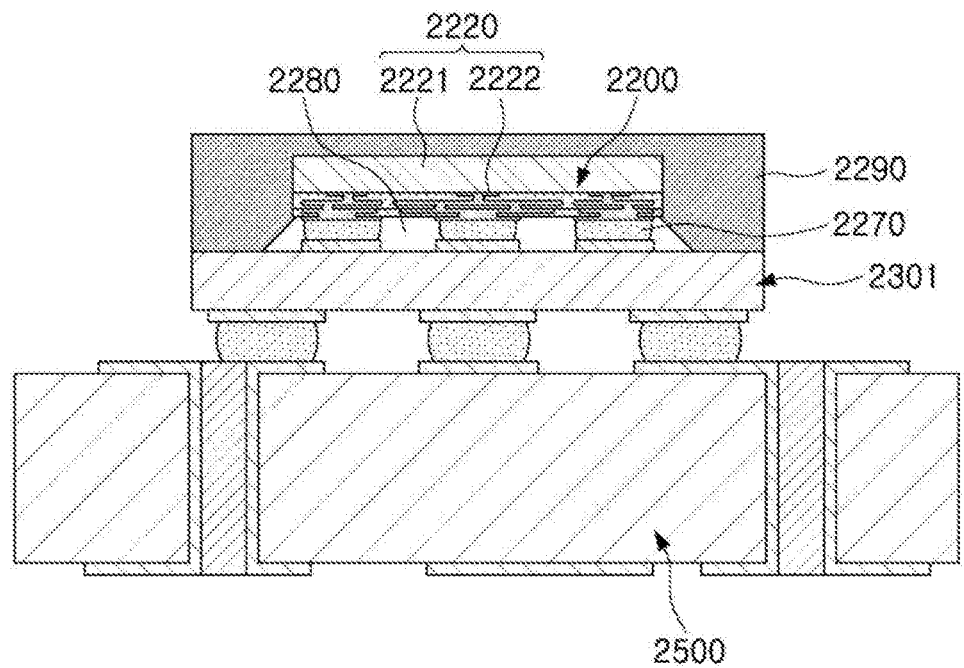
FIG. 5 is a schematic cross-sectional view illustrating a fan-in semiconductor package mounted on an interposer substrate that is ultimately mounted on a mainboard of an electronic device.
Figure 6:
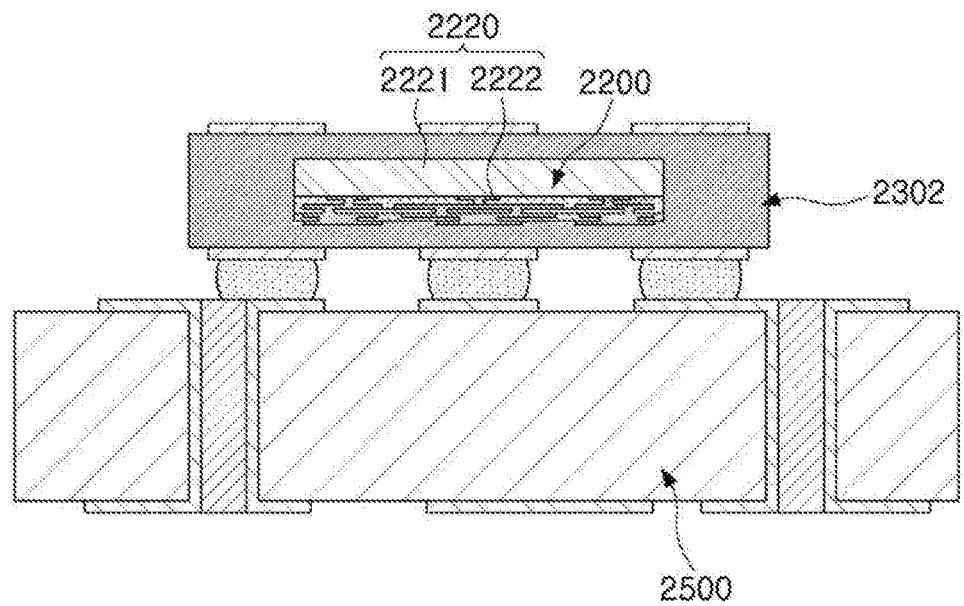
FIG. 6 is a schematic cross-sectional view illustrating a fan-in semiconductor package embedded in an interposer substrate that is ultimately mounted on a mainboard of an electronic device.

FIG. 5 is a schematic cross-sectional view illustrating a fan-in semiconductor package mounted on an interposer substrate that is ultimately mounted on a mainboard of an electronic device, and FIG. 6 is a schematic cross-sectional view illustrating a fan-in semiconductor package embedded in an interposer substrate that is ultimately mounted on a mainboard of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard (e.g., 2500) of the electronic device. Therefore, the fan-in semiconductor package may be mounted on the separate interposer substrate (e.g., 2301 or 2302) and be then mounted on the mainboard of the electronic device through a packaging process or may be mounted and used on the mainboard of the electronic device in a state in which it is embedded in the interposer substrate.

Fan-Out Semiconductor Package

Figure 7:
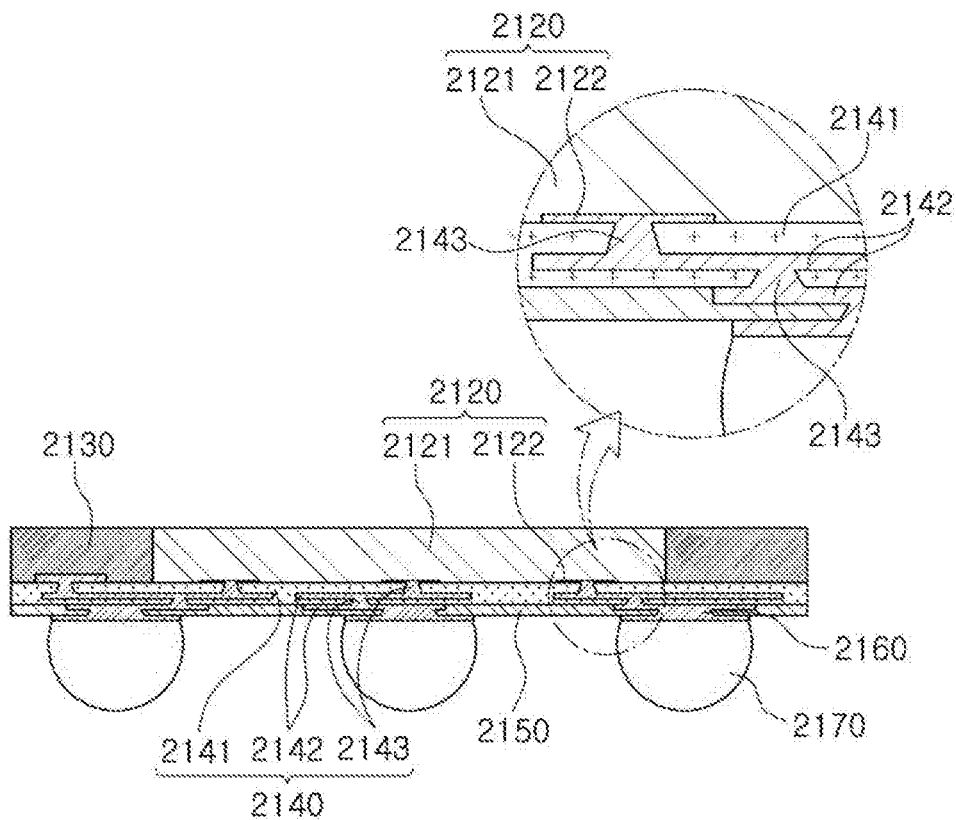
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the mainboard of the electronic device without using a separate interposer substrate, as described below.

Figure 8:
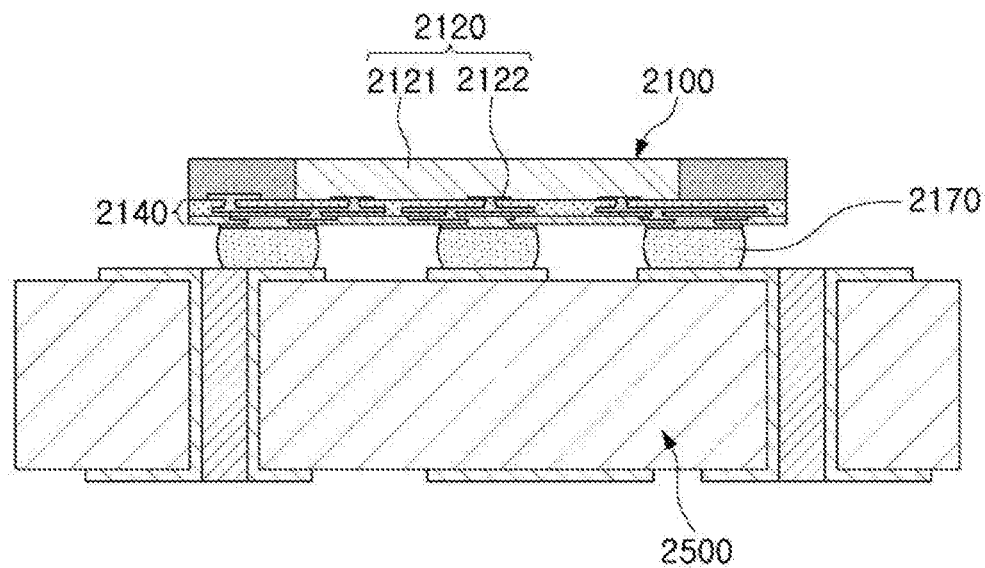
FIG. 8 is a schematic cross-sectional view illustrating a fan-out semiconductor package mounted on a mainboard of an electronic device.

FIG. 8 is a schematic cross-sectional view illustrating a fan-out semiconductor package mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB) and may solve a problem caused by the occurrence of a warpage phenomenon.

Meanwhile, the fan-out semiconductor package refers to a packaging technology for mounting the semiconductor chip on the mainboard of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Hereinbelow, various example embodiments of the present disclosure will be described in greater detail with reference to the accompanying drawings.

Figure 9:
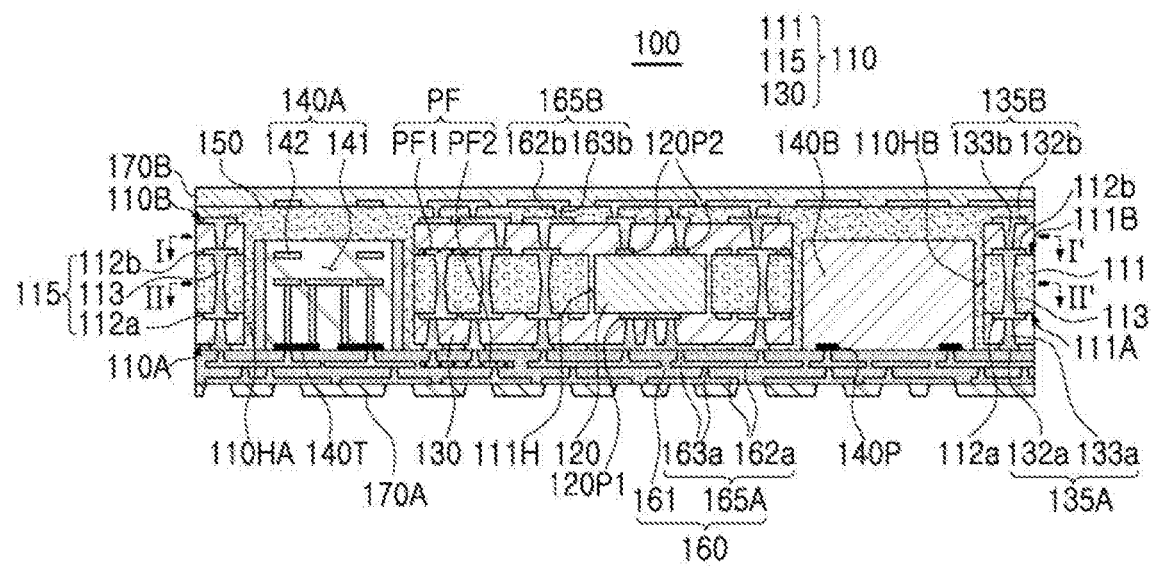
FIG. 9 is a schematic cross-sectional view of a semiconductor package according to an example embodiment of the present disclosure.
Figure 10:
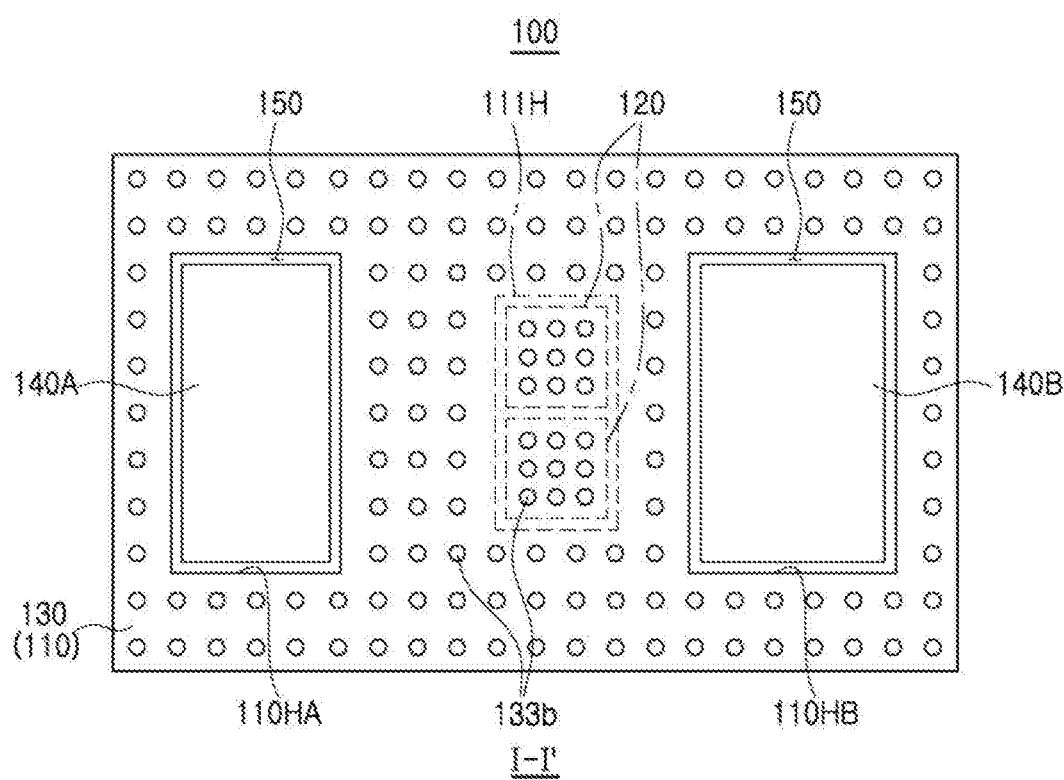
FIG. 10 is a plan view of the semiconductor package of FIG. 9, taken along line I-I' of FIG. 9.
Figure 11:
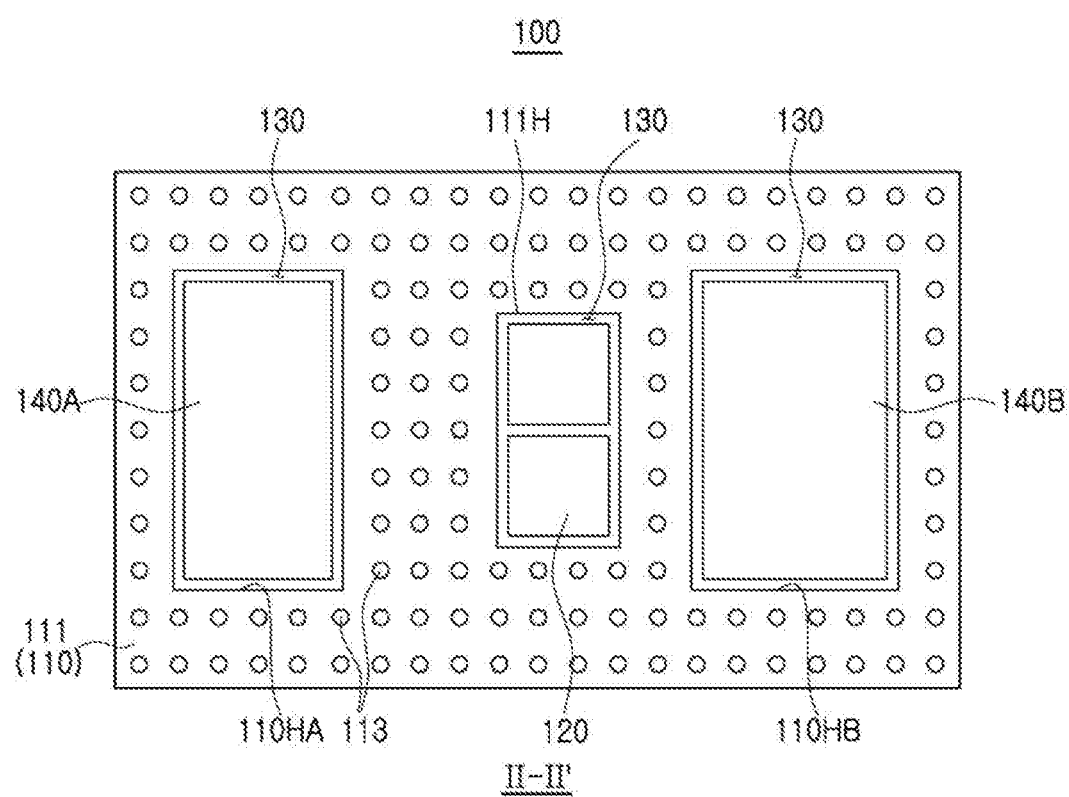
FIG. 11 is a plan view of the semiconductor package of FIG. 9, taken along line II-II' of FIG. 9.

FIG. 9 is a cross-sectional view schematically illustrating a semiconductor package according to an example embodiment of the present disclosure, and FIG. 10 and FIG. 11 are plan views of the semiconductor package of FIG. 9, taken along line I-I' and line II-II' of FIG. 9, respectively.

Referring to FIG. 9 to FIG. 11, a semiconductor package 100 according to the present example embodiment includes a core structure 110 having first and second surfaces 110A and 110B disposed opposite to each other, a first semiconductor chip 120 embedded in the core structure 110, and first and second wiring layers 135A and 135B disposed on the first and second surfaces 110A and 110B of the core structure 110, respectively.

The first semiconductor chip 120 embedded in the core structure 110 has, on both surfaces (that is, lower surface and upper surface) thereof, first and second contacts 120P1 and 120P2 disposed. In some example embodiments, the first semiconductor chip 120 may be a power device chip such as a power management integrated IC (PMIC). For example, the power device chip may include at least one of insulated gate bipolar transistor (IGBT) chip and a field effect transistor (FET) chip. The first contact 120P1 adjacent to a mainboard (not illustrated) may include a single contact having a relatively large area, and the second contact 120P2 disposed in an opposite direction from the first contact 120P1 may include a plurality of contacts each having a relatively small area.

The first and second wiring layers 135A and 135B may be connected to the first and second contacts 120P1 and 120P2, respectively. Likewise, at the level of the core structure 110, the first and second wiring layers 135A and 135B may be provided as a double-sided connection circuit for the first semiconductor chip 120.

The core structure 110 employed in the present example embodiment may include a frame 111 having first and second surfaces 111A and 111B disposed opposite to each other and having a cavity 111H having the first semiconductor chip 120 accommodated therein, a wiring structure 115 connecting the first and second surfaces 111A and 111B of the frame 111, and a first encapsulant 130 (also referred to as "encapsulation layer") disposed on the first and second surfaces 111A and 111B of the frame 111 and encapsulating the first semiconductor chip 120.

The wiring structure 115 may include wiring patterns 112a and 112b disposed on the first and second surfaces 111A and 111B of the frame 111, respectively, and a wiring via 113 penetrating the frame 111 and connecting to the wiring patterns 112a and 112b. The first and second surfaces 111A and 111B of the core structure 110, on which the first and second wiring layers 135A and 135B, may be provided by surfaces of the first encapsulant 130.

More specifically, the first wiring layer 135A may include a first wiring pattern 132a disposed on a surface of the first encapsulant 130 provided as the first surface 111A of the core structure 110, and a first wiring via 133a connected to the first wiring pattern 132a and partially penetrating the first encapsulant 130. The first wiring layer 135A has the first contact 120P1 and the wiring structure 115 (particularly, the wiring pattern 112a) of the first semiconductor chip 120 through the first wiring via 133a.

Similarly, the second wiring layer 135B may include a second wiring pattern 132b disposed on a surface of the first encapsulant 130 provided as the second surface 111B of the core structure 110, and a second wiring via 133b connected to the second wiring pattern 132b and partially penetrating the first encapsulant 130. The second wiring layer 135B has the second contact 120P2 and the wiring structure 115 (particularly, the wiring pattern 112b) of the first semiconductor chip 120 through the second wiring via 133b.

The core structure 110 employed in the present example embodiment has first and second through-holes 110HA and 110HB. Inner sidewalls of the first and second through-holes 110HA and 110HB are provided as cross sections of the core structure 110. More specifically, an inner sidewall of the cavity 111H for the first semiconductor chip 120 is formed of a surface of the frame 111 alone, while inner sidewalls of the first and second through-holes 110HA and 110HB are formed of a surface of the frame 111 and surfaces of the first encapsulant 120 disposed above and below the surface of the frame 111.

Chip components may be accommodated in the first and second through-holes 110HA and 110HB. In the present example embodiment, in the first through-hole 110HA, a chip antenna 140A having a connection terminal 140T may be accommodated, and in the second through-hole 110HB, a second semiconductor chip 140B having a connection pad 140P may be accommodated.

The chip antenna 140A may include a dielectric main body 141 having a plurality of dielectric layers, and a conductive pattern 142 disposed on the plurality of dielectric layers to form a radiation pattern or the like. For example, the second semiconductor chip 140B may be a control integrated circuit chip. Unlike the first semiconductor chip 120, the second semiconductor chip 140B may include a connection pad 140P disposed on one surface (that is, the active surface) thereof. For example, the second semiconductor chip 140B may include a central processing unit (CPU) and/or an IC chip implemented with a field programmable gate array (FPGA).

The semiconductor package 100 according to the present example embodiment may further include a frequency filter unit PF formed by a conductive pattern disposed in a region of the core structure 110 adjacent to the chip antenna 140A or to the first through-hole 110HA.

The frequency filter unit PF may be formed by a conductive pattern disposed in a region of the core structure 110 adjacent to the chip antenna 140A. The conductive pattern forming the frequency filter unit PF is provided as portions of at least one among the wiring structure 115 and/or the first and second wiring layers 135A and 135B and may include patterns of various patterns known in the art that form an inductor or a capacitor. The frequency filter unit PF employed in the present example embodiment may include a first filter PF1 implemented in a region of the wiring structure 115 and a second filter PF2 implemented in a region of the first redistribution layer 135A.

The semiconductor package 100 according to the present example embodiment may include a second encapsulant 150 (also referred to as "encapsulant") encapsulating the chip antenna 140A and the second semiconductor chip 140B and disposed on the second surface 110B of the core structure 110, a first redistribution layer 165A disposed on the first surface 110A of the core structure 110 and connected to the first wiring layer 135A, and a second redistribution layer 165B disposed on the second encapsulant 150 and connected to the second wiring layer 135B.

The first and second redistribution layers 165A and 165B may be formed in a single level or a plurality of levels, according to necessity.

In the present example embodiment, the first redistribution layer 165A is provided in a 2-level structure and includes first redistribution patterns 162a, respectively disposed on two insulating layers 161, and a first redistribution via 163a penetrating the insulating layers 161. In the present application, a redistribution structure including the insulating layers 161 and the first redistribution layer 165A may also be referred to as "connection structure 160". The first redistribution layer 165A may be connected also to the connection terminal 140T of the chip antenna 140A and to the connection pad 140P of the second semiconductor chip 140B.

The second encapsulant 150 may be disposed on the second surface 110B of the core structure 110 so as to cover the second wiring layer 135B while partially or completely filling space inside the first and second through-holes 110HA and 110HB. The second redistribution layer 165B may penetrate the second encapsulant 150 to connect to the second wiring layer 135B. The second redistribution layer 165B may include a second redistribution pattern 162b disposed on a surface of the second encapsulant 150 and a second redistribution via 163b partially penetrating the second encapsulant 150 to connect the second redistribution pattern 162b and the second wiring layer 135B to each other. According to necessity, the second redistribution layer 165B may further include an insulating layer to be implemented in a multi-level redistribution structure similar to that of the connection structure 160.

The semiconductor package 100 may further include first and second passivation layers 170A and 170B disposed on the first and second surfaces 110A and 110B of the core structure 110 so as to cover the first and second redistribution layers 165A and 165B, respectively.

As described above, a semiconductor package of a novel structure may be provided by embedding the first semiconductor chip 120 (for example, a power device chip) in the frame 111 using a substrate forming process, and then embedding a chip component, such as the second semiconductor chip 140A, in the core structure 110 by PLP technique. Fabrication processes of the semiconductor package according to the present example embodiment will be described in greater detail with reference to the processes illustrated in FIG. 12 and FIG. 13.

Hereinbelow, each of components included in the semiconductor package 100 according to the present example embodiment will be described in greater detail.

The frame 111, depending on the material of which it is formed, may further improve rigidity of the semiconductor package 100, and is not limited to but may serve to ensure a uniform thickness of the first encapsulant 130. The frame 111 is illustrated as having a single cavity 111H for a first semiconductor chip, however, the chip components to be embedded may also include other chip components, such as passive components, and the cavity 111H may be provided in plurality.

The insulating member of the frame 110 is not particularly limited but may include a thermosetting resin such as an epoxy resin, a thermoplastic resin such as polyimide, and a resin in which the thermosetting resin or thermoplastic resin is impregnated with an inorganic filler in a core material such as glass fiber, glass cloth, and gloss fabric. For example, a prepreg, Ajinomoto Build-up Film (ABF), FR-4, bismaleimide triazine (BT), or the like, may be used for the insulating member.

The first encapsulant 130 encapsulates the frame 111 and at least a portion of the first semiconductor chip 120, and the second encapsulant 150 encapsulates the core structure 110, the chip antenna 140A, and at least a portion of the second semiconductor chip 140B. The first and second encapsulants 130 and 150 may include an identical insulating material or different insulating materials from each other. For the insulating material, there may be used materials containing an inorganic filler and an insulating resin, for example, a thermosetting resin such as an epoxy resin, or a thermoplastic resin such as polyimide, or a resin in which the thermosetting resin or thermoplastic resin includes a stiffener such as an inorganic filler, for example, ABF, FR-4, BT resin, or the like. Furthermore, molding materials known in the art, such as EMC, may also be used for the insulating material, and if desired, a photo-imageable encapsulant (PIE) may also be used. Furthermore, if desired, for the insulating material, there may be used materials in which an insulating resin such as a thermosetting resin and a thermoplastic resin is impregnated with an inorganic filler and/or a core material such as glass fiber, glass cloth, and glass fabric.

For the insulating layer 161 of the connection structure 160, any one of the aforementioned insulating materials may be used, and in some example embodiments, a photosensitive insulating material such as PID resin may be used. When the insulating layer 161 are formed using a photosensitive material, the insulating layer 161 can be fabricated relatively thinner, and the first redistribution via 163a can be arranged with a fine pitch more conveniently. When the insulating layer 161 includes a plurality of insulating layers 161, the insulating layers 161 may be of the same material or of different materials from each other as desired. Even when the insulating layer 161 is formed as multiple layers, depending on the process, they may be integrated such that the boundaries between adjacent layers are not readily apparent.

The first and second redistribution layers 165A and 165B, along with the first and second wiring layers 135A and 135B, may serve to redistribute the embedded components such as the first and second semiconductor chips. For example, the first and second redistribution layers 165A and 165B and the first and second wiring layers 135A and 135B may include a conductive material, such as copper (Cu), aluminum (Al), silver (Ag), tin (Sn), gold (Au), nickel (Ni), lead (Pb), titanium (Ti), or alloys thereof, and may serve various functions according to a specification of the design of a corresponding layer. For example, at least one among the first and second redistribution layers 165A and 165B and the first and second wiring layers 135A and 135B may include a ground (GrouND: GND) pattern, a power (PoWeR: PWR) pattern, a signal (Signal: S) pattern, or the like. Here, the S pattern includes various signals, such as data signals, except for the GND pattern, the PWR pattern, and the like. In addition, the first and second redistribution layers 165A and 165B and the first and second wiring layers 135A and 135B may include via pads, connection terminal pads, or the like.

The first and second passivation layers 170A and 170B may protect the semiconductor package 100 from external physical/chemical damage and the like. The first and second passivation layers 170A and 170B may contain an insulating resin and an inorganic filler while not containing glass fiber. For example, the first and second passivation layers 170A and 170B may be ABF but are not limited thereto. The first and second passivation layers 170A and 170B may have openings that expose portions of the first and second redistribution layers 165A and 165B. For example, as illustrated in FIG. 9, the openings may be formed in an amount of several tens to several thousands in the first passivation layer 165A.

Figure 12:
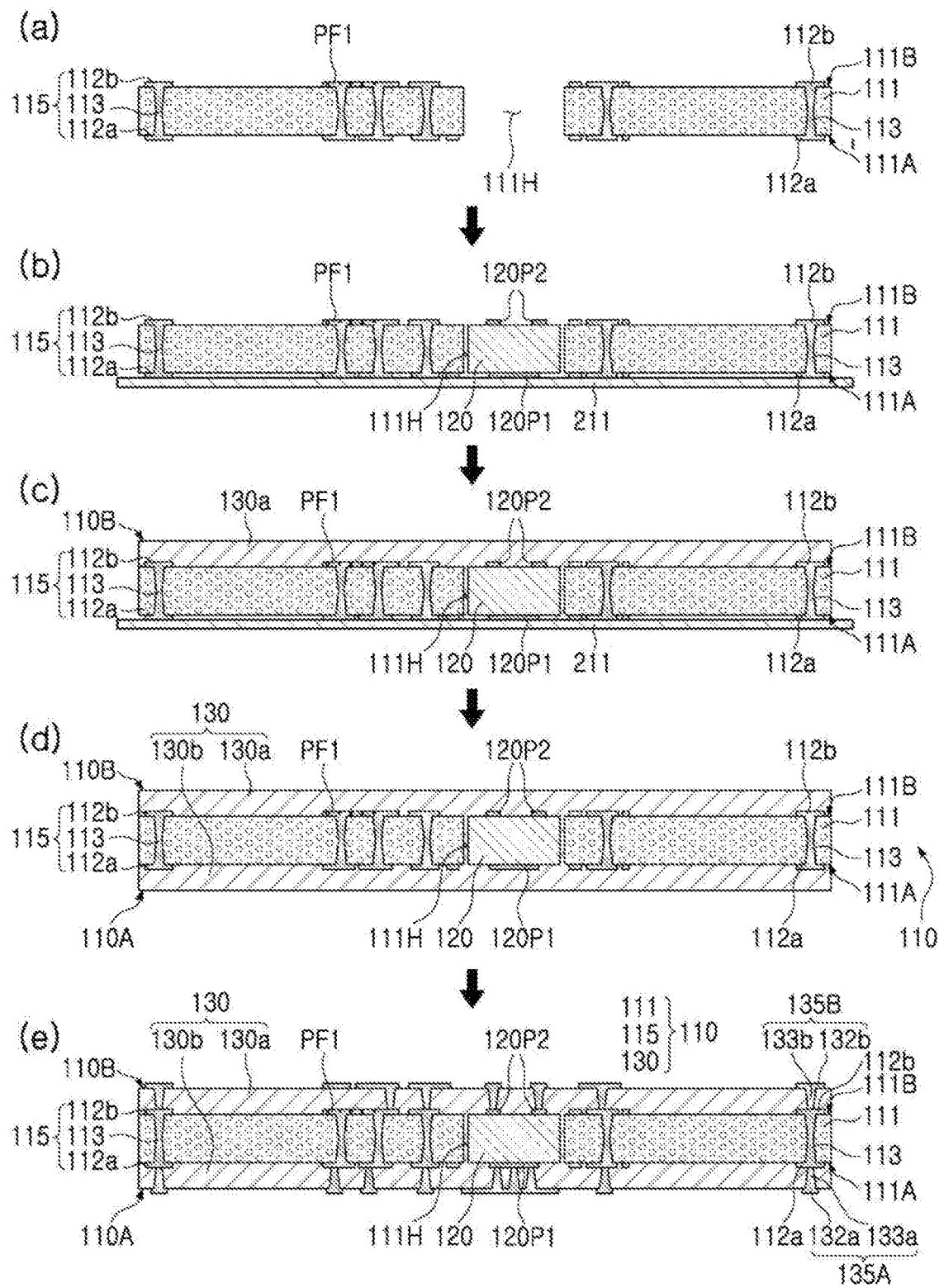
FIG. 12 shows cross-sectional views illustrating main processes of a method of fabricating the core structure of FIG. 9.

FIG. 12 show cross-sectional views illustrating main processes of a method of fabricating the core structure of FIG. 9.

Referring to step (a) in FIG. 12, a cavity 111H is formed in a frame 111 having a wiring structure 115.

The frame 111 having first and second surfaces 111A and 111B disposed opposite to each other is provided. For example, a copper clad laminate (CCL) may be used for the frame 111. By using a plating process, wiring patterns 112a and 112b are formed, together with a wiring via 113, on the first and second surfaces 111A and 111B of the frame 111. Subsequently, by using a process such as laser drilling or sandblasting, the cavity 111H is formed in the region in which a first semiconductor will be embedded in the frame 111. In this process, a first filter PF1, which is a part of a frequency filter unit PF, may be formed. In some embodiments, the first filter PF1 may be composed of an inductor and/or a capacitor, which is provided as a portion of a wiring structure 115 disposed in the region in which a chip antenna will be disposed.

Referring to step (b) in FIG. 12, the frame 111 is disposed on a first carrier 211, and a first semiconductor 120 is disposed in the cavity 111H.

The first carrier 211 may be an adhesive tape. The frame 111 is disposed on the first carrier 211, and the first semiconductor chip 120 is mounted in the cavity 111H and on the first carrier 211. The first semiconductor chip 120 has a first contact 120P1 on one surface and a second contact 120P2 on the other surface thereof. The first semiconductor chip 120 may be a power device chip such as a PMIC. For example, the power device chip may include at least one of an IGBT chip and a FET chip. According to necessity, an additional cavity may be formed, and the first semiconductor chip 120 may further include a semiconductor chip having a different form and a passive component.

Referring to step (c) in FIG. 12, a first region 130a of a first encapsulant is formed to encapsulate the first semiconductor chip 120 and cover the second surface 111B of the frame 111, and referring to step (d) in FIG. 12, the first carrier 211 is removed from the first surface 111A of the frame 111, and a second region 130b of the first encapsulant is formed on the first surface 111A of the frame 111.

In the present example embodiment, the first encapsulant 130 may be formed by an encapsulation process including two steps. The first semiconductor chip 120 may be embedded by the first encapsulant 130. The first encapsulant 130 covers the first and second surfaces 111A and 111B of the frame 111 and may provide a core structure 110 along with the frame 111.

Referring to step (e) in FIG. 12, first and second wiring layers 135A and 135B are formed on the first and second surfaces 110A and 110B of the core structure 110.

The first and second wiring layers 135A and 135B may be formed using a laser drilling process and a plating process.

In some example embodiments using a photosensitive insulating material for the first encapsulant 130, instead of the laser drilling process, a photolithography process may be used to implement the first and second wiring layers 135A and 135B in even finer patterns.

More specifically, the first wiring layer 135A may include a first wiring pattern 132a disposed on a first surface 110A of the core structure 110, and a first wiring via 133a connecting the first wiring pattern 132a to the first contact 120P1 of the first semiconductor chip 120 and to the wiring pattern 112a. Likewise, the second wiring layer 135B may include a second wiring pattern 132b disposed on a second surface 110B of the core structure 110, and a second wiring via 133b connecting the second wiring pattern 132b to the second contact 120P2 of the first semiconductor chip 120 and to the wiring pattern 112b.

Figure 13:
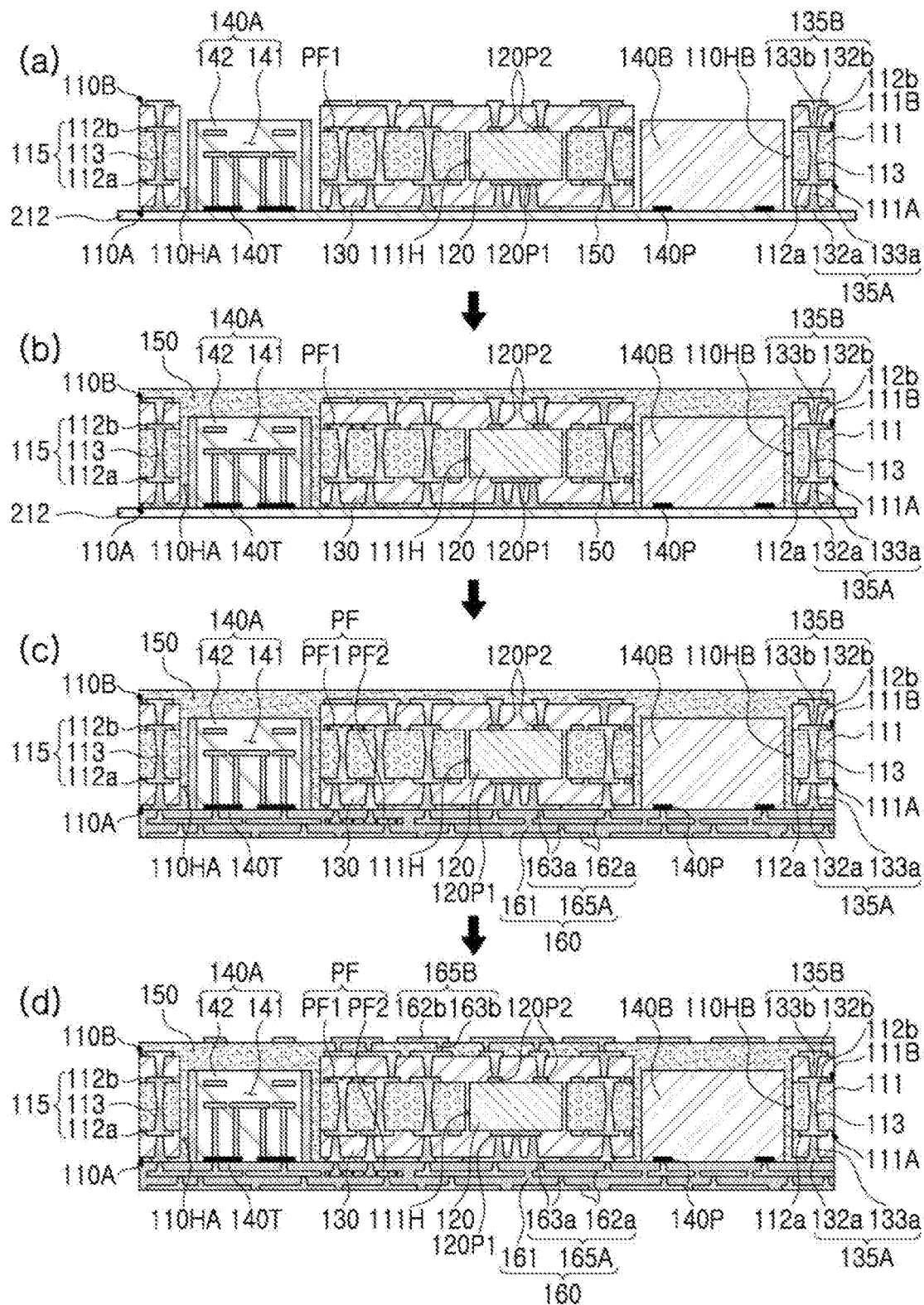
FIG. 13 shows cross-sectional views illustrating main processes of a method of fabricating the semiconductor package of FIG. 9.

FIG. 13 shows cross-sectional views illustrating main processes of a method of fabricating the semiconductor package of FIG. 9, and these processes can be understood as processes performed using the core structure of shown in step (e) in FIG. 12.

Referring to step (a) in FIG. 13, first and second through-holes 110HA and 110HB are formed in the core structure 110, and chip components 140A and 140B are disposed in the first and second through-holes 110HA and 110HB of the core structure 110.

By using a laser drilling process or a sandblasting process, the first and second through-holes 110HA and 110HB are formed in the core structure 110, and the core structure 110 having the first and second through-holes 110HA and 110HB formed therein is disposed on a second carrier 212. In the first and second through-holes 110HA and 110HB of the core structure 110, a chip antenna 140A and a second semiconductor chip 140B may be disposed as chip components. In the present example embodiment, unlike the first semiconductor chip 120, the second semiconductor chip 140B may be a semiconductor chip having a connection pad 140P disposed on one surface thereof. For example, the second semiconductor chip 140B may include an IC chip of various forms, such as a CPU and/or a FPGA.

Referring to step (b) in FIG. 13, a second encapsulant 150 may be formed to encapsulate the chip components 140A and 140B and cover the second surface 110B of the core structure 110. Referring to step (c) in FIG. 13, the second carrier 212 is removed from the first surface 110A of the core structure 110, and a connection structure 160 is formed on the first surface 110A of the core structure 110.

The process of forming the second encapsulant 150 may be carried out in a manner similar to that of the process of forming the first region 130a of the first encapsulant. After removing the second carrier 212, a connection structure 160 may be formed on the first surface 110A of the core structure 110 by using a process of forming an insulating layer 161 and the first redistribution layer 165A. The first redistribution layer 165A may be connected not only to the connection terminal 140T of the chip antenna 140A and the connection pad 140P of the second semiconductor chip 140B, but also to the first wiring layer 135A. Through the above configuration, the first semiconductor chip 120 can connect to the chip antenna 140A and to the second semiconductor chip 140B through the first wiring layer 135A and the first redistribution layer 165A.

The insulating layer 161 may be a photosensitive insulating material, and in this case, the first redistribution layer may be implemented in even finer patterns by a photolithography process. In this process, a second filter PF2, which is another portion of the frequency filter unit PF, may be formed. The second filter PF2 may be formed as desired by constituting an inductor and/or a capacitor using a portion of the first redistribution layer 165A disposed in a region in which a chip antenna will be disposed, and the second filter PF2 may be combined with the first filter PF1 to provide a frequency filter unit PF for the chip antenna 140A.

Referring to step (d) in FIG. 13, the second redistribution layer 165B is formed on the second surface 110B of the core structure 110.

The process of forming the second redistribution layer may be formed by a plating process. The second redistribution layer 165B disposed on a surface of the second encapsulant 150, and a second redistribution via 163b partially penetrating the second encapsulant 150 to connect the second redistribution pattern 162b and the second wiring layer 135B to each other. Alternatively, if desired, the second redistribution layer 165B may further include an insulating layer and be implemented in a multi-level redistribution structure similar to that of the connection structure 160.

As described above, a semiconductor package of a novel structure may be provided by embedding the first semiconductor chip 120 (for example, a power device chip) on the frame 111 through using a substrate forming process known in the art (see FIG. 12), and embedding a chip component such as the second semiconductor chip 140A (for example, an IC chip) in the core structure 110 by PLP technique, thereby forming the redistribution structures 165A and 165B (see FIG. 13). By reducing the size of a package, thereby reducing signal paths between the components therein, a transmission loss due to the signal paths can be reduced, and furthermore, by using various wiring structures, elements such as frequency filters can be further accommodated therein.

For example, the mounting space inside a multi-functionalized module can be appropriately utilized in accordance with a connection scheme (double-sided contacts, single-side contacts, etc.) of semiconductor chips in a package to significantly reduce the size and thickness of the package. Furthermore, such a package may be advantageously utilized in automotive components that are merged with information technology (IT) requiring various chip components.

Figure 14:
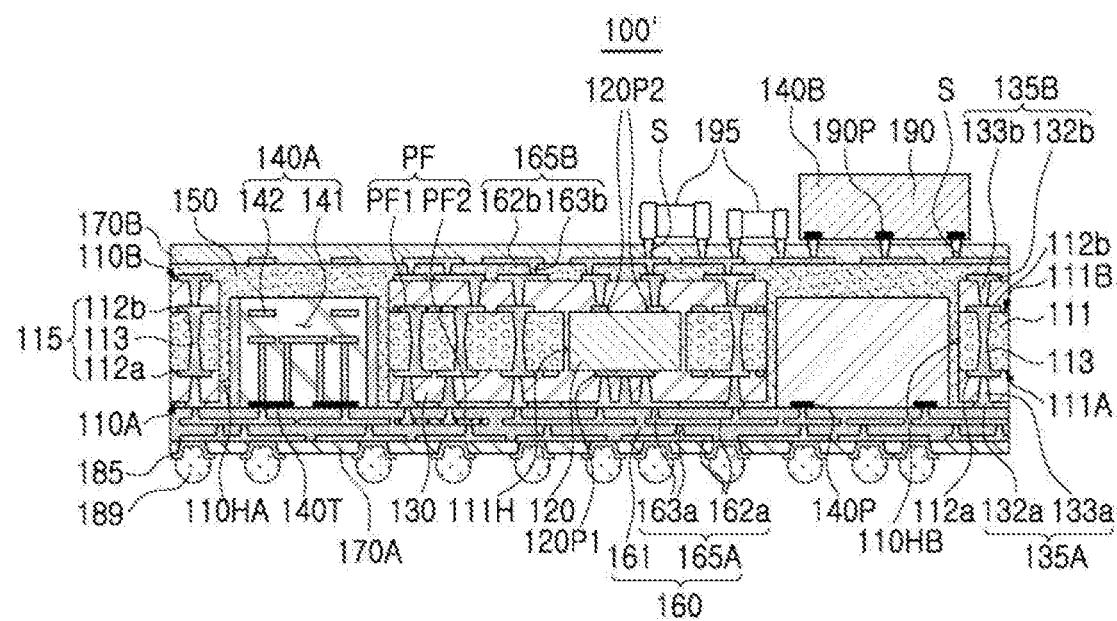
FIG. 14 is a cross-sectional view schematically illustrating a semiconductor package according to an example embodiment of the present disclosure.

In addition, since a wiring structure similar to the first redistribution layer may be provided in an upper region of a semiconductor package, as illustrated in FIG. 14, various components may be further mounted on an upper surface of the semiconductor package.

FIG. 14 is a cross-sectional view schematically illustrating a semiconductor package according to an example embodiment of the present disclosure.

Referring to FIG. 14, a semiconductor package 100' according to the present example embodiment may be understood as being similar to the structure illustrated in FIGS. 9 through 11 except the feature of utilizing an upper surface of the semiconductor package as an additional mounting region for chip components and the feature of including an electrical connection metal 189. Components in the present example embodiment, unless explicitly stated to the contrary, may be understood with reference to identical or similar components of the semiconductor package 100 illustrated in FIGS. 9 through 11.

The upper surface of the semiconductor package 100' according to the present example embodiment may be utilized as an additional mounting space. Openings exposing portions of the second redistribution layer 165B may be formed in the second passivation layer 170B, and additional chip components 190 and 195 may be mounted therein.

Additional chip components may include a plurality of passive components 195 and a third semiconductor chip 190.

The plurality of passive components 195 may be each independently a multilayer ceramic capacitor (MLCC), a low-inductance chip capacitor (LICC), an inductor, beads, or a filter of various types. The third semiconductor chip 190 may be a semiconductor chip such as an integrated circuit chip or a memory chip. The passive components 195 are illustrated as being flip-chip bonded in the present example embodiment; however, the passive components 195, since they are disposed on the upper surface of the semiconductor package 100', may be in a wire-bonded connection.

The semiconductor package 100' may include an under-bump metal (UBM) layer 185 connected to the first redistribution layer 165A through the openings of the first passivation layer 170A, and an electrical connection metal 189 on the UBM layer 185.

The UBM layer 185 improves connection reliability of the electrical connection metal 189, and consequently, serves to improve board level reliability of the semiconductor package 100'. The UBM layer 185 may be connected to portions of the first redistribution layer 165A exposed through the openings of the first passivation layer 170A. The UBM layer 185 is not limited to but may be formed using a conductive material known in the art, such as metal, on the openings of the first passivation layer 170A by using a metallization method known in the art.

The electrical connection metal 189 may be an additional component for physically and/or electrically connecting the semiconductor package 100' to an external component. For example, the semiconductor package 100' may be mounted on a mainboard of an electrical device by using the electrical connection metal 189. The electrical connection metal 189 may be formed using a low melting-point metal such as a solder or the like. The electrical connection metal 189 may be a land, a ball, a pin, or the like. The electrical connection metal 189 may be formed in multiple layers or in a single layer. The electrical connection metal 189 is not limited to any particular number of electrical connection metals 189, and furthermore, the electrical connection metals 189 are not limited to any particular interval, arrangement, or the like.

Figure 15:
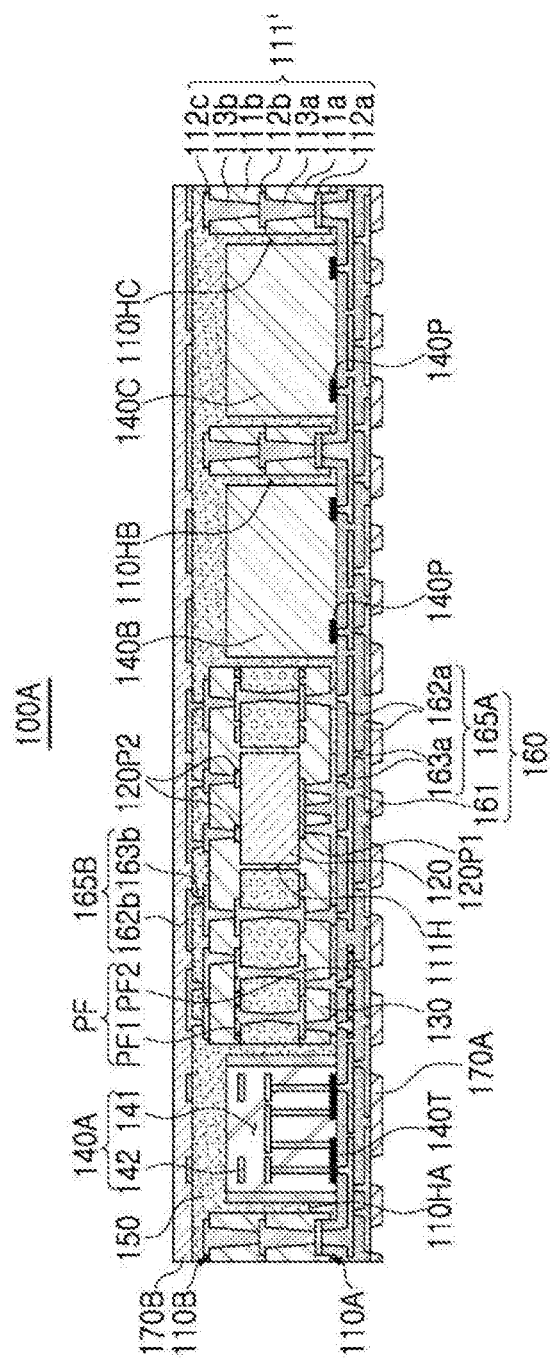
FIG. 15 and FIG. 16 are cross-sectional views schematically illustrating a semiconductor package according to various example embodiments of the present disclosure.

FIG. 15 is a cross-sectional view schematically illustrating a semiconductor package according to an example embodiment of the present disclosure.

Referring to FIG. 15, a semiconductor package 100A according to the present example embodiment may be understood as being similar to the structure illustrated in FIGS. 9 through 11, except for the feature of including a plurality of second semiconductor chips 140B and 140C, and the feature of the frame 111' having a wiring structure different from that of the frame illustrated in FIGS. 9 through 11. Components in the present example embodiment, unless explicitly stated to the contrary, may be understood with reference to identical or similar components of the semiconductor package 100 illustrated in FIGS. 9 through 11.

The semiconductor package 100A, unlike the example embodiment previously described, may include the first to third through-holes 110HA, 110HB, and 110HC, and two semiconductor chips 140B and 140C may be contained in second and third through-holes 110HB and 110HC. For example, the two second semiconductor chips 140B and 140C may be semiconductor chips of an identical type or may be semiconductor chips of different types. For example, one of the two semiconductor chips 140B and 140C may be a control integrated circuit chip while the other is a memory semiconductor chip. If desired, portions of the through-holes may be utilized as the space for placing passive components.

A frame 110' employed in the present example embodiment includes first and second insulating layers 111a and 111b providing the first and second surfaces 110A and 110B, respectively. The wiring structure may include a first wiring pattern 112a embedded in the first insulating layer 111a and in contact with the connection structure 160, a second wiring pattern 112b disposed on the other surface of the first insulating layer 111a opposing one surface of the first insulating layer 111a in which the first wiring pattern 112a is embedded, a third wiring pattern 113c disposed on the other surface of the second insulating layer 111b opposing one surface of the second insulating layer 111b on which the second wiring pattern 112b is disposed, a first wiring via 113a penetrating the first insulating layer 111a to connect the first and second wiring patterns 112a and 112b to each other, and a second wiring via 113b penetrating the second insulating layer 111b to connect the second and third wiring patterns 112b and 112c to each other.

In the present example embodiment, the first wiring pattern 112a may be recessed into the first insulating layer 111a. When the first wiring pattern 112a is recessed into the first insulating layer 111a, there may be formed a step between a lower surface of the first insulating layer 111a and a lower surface of the first wiring pattern 112a, and such a step may serve to prevent a material forming the second encapsulant 150 from bleeding out to contaminate the first wiring pattern 112a.

Figure 16:
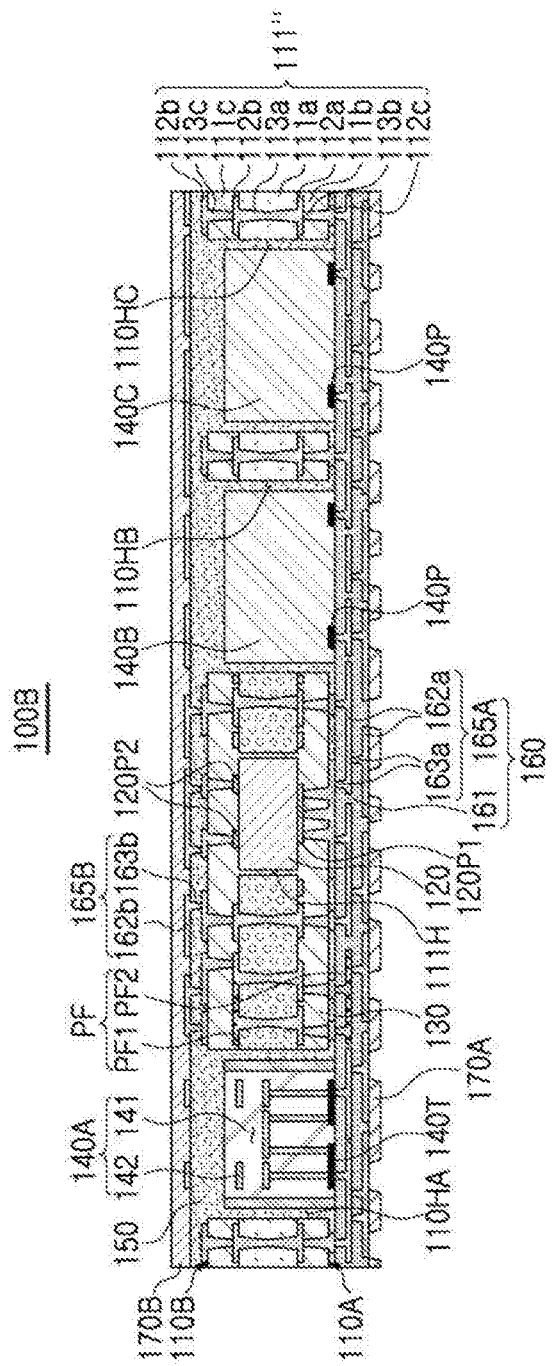

FIG. 16 is a cross-sectional view schematically illustrating a semiconductor package according to an example embodiment of the present disclosure.

Referring to FIG. 16, a semiconductor package 100B according to the present example embodiment may be understood as being similar to the structure illustrated in FIGS. 9 through 11, except for the feature of including a plurality of second semiconductor chips 140B and 140C similarly as described in the previous example embodiment, and the feature of a frame 111" having a wiring structure different from that of the frame illustrated in FIGS. 9 through 11. Components in the present example embodiment, unless explicitly stated to the contrary, may be understood with reference to identical or similar components of the semiconductor package 100 illustrated in FIGS. 9 through 11.

A frame 110" employed in the present example embodiment includes a first insulating layer 111a, a first wiring pattern 112a disposed on one surface of the first insulating layer 111a, a second wiring pattern 112b disposed on the other surface of the first insulating layer 111a, a second insulating layer 111b disposed on one surface of the first insulating layer 111a and covering at least portions of the first wiring pattern 112a, a third wiring pattern 112c disposed on the other surface of the second insulating layer 111b, opposing one surface of the second insulating layer 111b in which the first wiring pattern 112a is embedded, a third insulating layer 111c disposed on the other surface of the first insulating layer 111a and covering at least portions of the second wiring pattern 112b, a fourth wiring pattern 112d disposed on the other surface of the third insulating layer 111c, opposing one surface of the third insulating layer 111c in which the second wiring pattern 112b is embedded, a first wiring via 113a penetrating the first insulating layer 111a and electrically connecting the first and second wiring patterns 112a and 112b to each other, a second wiring via 113b penetrating the second insulating layer 111b and electrically connecting the first and third wiring patterns 112a and 112c to each other, and a third wiring via 113c penetrating the third insulating layer 111c and electrically connecting the second and fourth wiring patterns 112b and 112d to each other. The frame 110 employed in the present example embodiment, due to including a relatively greater number of wiring patterns 112a, 112b, 112c, and 112d, serves to further simplify a first redistribution layer 165A of a connection structure 160.

The first insulating layer 111a may have a thickness greater than a thickness of each of the second insulating layer 111b and the third insulating layer 111c. The first insulating layer 111a may be relatively thicker for maintaining basic rigidity, and the second insulating layer 111b and the third insulating layer 111c may be incorporated in order to form a greater number of wiring patterns 112c and 112d. The first insulating layer 111a may include an insulating material different from the second insulating layer 111b and the third insulating layer 111c. For example, the first insulating layer 111a is not limited to but may be, for example, a prepreg including a core material such as glass fiber, an inorganic filler, and an insulating resin, and the second insulating layer 111b and the third insulating layer 111c are not limited to but may be an ABF or a PID including an inorganic filler and an insulating resin. Similarly, the first wiring via 113a penetrating the first insulating layer 111a may have a diameter greater than a diameter of each of the second and third wiring vias 113b and 113c penetrating the second and third insulating layers 111b and 111c, respectively. Furthermore, the first wiring via 113a may have a cylindrical shape or a shape similar to an hourglass, whereas the second and third wiring vias 113b and 113c may have tapering shapes tapering in opposite directions from each other. A thickness of each of the first to fourth wiring patterns 112a, 112b, 112c, and 112d may be greater than a thickness of a first redistribution layer 165A of a connection structure 160.

As set forth in the example embodiments described above, various semiconductor chips required for a multi-functionalized module may be embedded in appropriate spaces inside a semiconductor package according to a connection scheme (double-sided, single-sided, etc.) to significantly reduce the size and the thickness of the semiconductor package. The semiconductor package according to the example embodiments may be advantageously utilized in a smartphone module or an automotive module merged with IT technology (for example, 5G communications), thus requiring various chip components (for example, face recognition, 3D camera, artificial intelligence, etc.)

A statement that an element is "connected to" or "coupled to" another element includes a case in which the element is indirectly connected or coupled to the other element by using an adhesive layer or the like, as well as a case in which the element is directly connected or coupled to the other element. Also, a statement that one element is "electrically connected to" another element includes a case where the two elements are in physical contact with each other, as well as a case where the two elements are not in physical contact with each other. Also, the terms "first," "second," and any variation thereof used herein do not denote any order and/or importance or the like but are used to distinguish one element from another. For example, a first element could be termed as a second element, and similarly, a second element could be termed as a first element, without departing from the scope of the present disclosure.

The term "embodiments" used in the present disclosure does not refer to the same embodiment, and embodiments are provided to highlight characteristic features of one embodiment to another embodiment. However, any one embodiment described herein may be combined with other features or characteristics described in respect of another embodiment. For example, it should be understood that features described with respect to one embodiment may apply to another embodiment unless explicitly stated otherwise.

The terms used in the present disclosure are used merely to illustrate embodiments of the present disclosure and not to limit the scope of the present disclosure. Furthermore, the use of the singular includes the plural unless specifically stated otherwise.

What is claimed is:

1. A semiconductor package, comprising:
    a core structure having a frame having a cavity penetrating first and second surfaces of the frame opposing each other, a wiring structure penetrating the frame to connect the first and second surfaces to each other, a first semiconductor chip disposed in the cavity and having a first surface having a first contact and a second surface opposing the first surface of the first semiconductor chip and having a second contact, a first encapsulant encapsulating the first semiconductor chip and disposed on the first and second surfaces of the frame, and a through-hole penetrating portions of the first encapsulant and the frame, wherein the core structure has first and second surfaces corresponding to the first and second surfaces of the frame, respectively;
    a first wiring layer disposed on the first surface of the core structure and penetrating the first encapsulant to connect to the first contact of the first semiconductor chip;
    a second wiring layer disposed on the second surface of the core structure and penetrating the first encapsulant to connect to the second contact of the first semiconductor chip;
    a chip component disposed in the through-hole of the core structure and having a connection terminal;
    a connection structure disposed on the first surface of the core structure and having a redistribution layer connected to the connection terminal of the chip component and to the first wiring layer; and
    a second encapsulant disposed on the second surface of the core structure and encapsulating the chip component,
    wherein the chip component includes at least one of a chip antenna and a second semiconductor chip.

2. The semiconductor package of claim 1, wherein the through-hole includes first and second through-holes, wherein the chip antenna is disposed in the first through-hole, and the second semiconductor chip is disposed in the second through-hole.

3. The semiconductor package of claim 2, further comprising a frequency filter unit including a conductive pattern disposed in a region of the core structure adjacent to the chip antenna.

4. The semiconductor package of claim 3, wherein the conductive pattern comprises a portion of at least one of the wiring structure and the first and second wiring layers.

5. The semiconductor package of claim 1, wherein an inner sidewall of the through-hole is provided as a surface of the frame and surfaces of the first encapsulant disposed above and below the surface of the frame, respectively.

6. The semiconductor package of claim 1, wherein the first semiconductor chip includes a power device chip.

7. The semiconductor package of claim 6, wherein the power device chip includes at least one of an insulated gate bipolar transistor (IGBT) and a field effect transistor (FET).

8. The semiconductor package of claim 1, further comprising an additional redistribution layer disposed on the second encapsulant and penetrating the second encapsulant to connect to the second wiring layer.

9. The semiconductor package of claim 8, further comprising a passivation layer disposed on the second encapsulant and having a plurality of openings exposing portions of the additional redistribution layer.

10. The semiconductor package of claim 9, further comprising at least another chip component disposed on the passivation layer and connected to a portion of the additional redistribution layer.

11. A semiconductor package, comprising:
a core structure having first and second surfaces opposing each other, and first and second through-holes;
a first semiconductor chip embedded in the core structure and having first and second contacts respectively disposed on two opposing surfaces;
a first wiring layer disposed on the first surface of the core structure and connected to the first contact of the first semiconductor chip;
a second wiring layer disposed on the second surface of the core structure and connected to the second contact of the first semiconductor chip;
a chip antenna disposed in the first through-hole of the core structure and having a connection terminal;
a second semiconductor chip disposed in the second through-hole of the core structure and having a connection pad;
a first redistribution layer disposed on the first surface of the core structure, and connected to the connection terminal, the connection pad, and the first wiring layer;
an encapsulant encapsulating the chip antenna and the second semiconductor chip, and disposed on the second surface of the core structure; and
a second redistribution layer disposed on the encapsulant and penetrating the encapsulant to connect the second wiring layer.

12. The semiconductor package of claim 11, wherein the core structure includes a frame having first and second surfaces opposing each other and a cavity having the first semiconductor chip embedded therein, a wiring structure connecting the first and second surfaces of the frame to each other, and an encapsulation layer encapsulating the first semiconductor chip and disposed on the first and second surfaces of the frame.

13. The semiconductor package of claim 12, further comprising a frequency filter unit formed by a conductive pattern disposed in a region of the core structure adjacent to the chip antenna, wherein the conductive pattern comprises a portion of at least one of the wiring structure and the first and second wiring layers.

14. The semiconductor package of claim 11, wherein the first semiconductor chip is a power device chip, and the second semiconductor chip includes a control integrated circuit chip.

15. The semiconductor package of claim 11, further comprising:
a passivation layer disposed on the encapsulant and having a plurality of openings exposing a portion of the second redistribution layer; and
at least one chip component disposed on the passivation layer and connected to the portion of the second redistribution layer,
wherein the at least one chip component includes at least one of a third semiconductor chip and a passive component.

16. A semiconductor package, comprising:
a frame having a cavity penetrating first and second surfaces of the frame opposing each other, and a wiring structure penetrating the frame to connect first and second wiring patterns respectively disposed on the first and second surfaces to each other;
a first semiconductor chip disposed in the cavity, and having a first surface having a first contact and a second surface opposing the first surface of the first semiconductor chip and having a second contact;
a first encapsulant encapsulating the first semiconductor chip and disposed on opposite sides of the frame to cover the first and second surfaces of the frame, the first encapsulant separating the first semiconductor chip from the frame;
first and second wiring layers respectively disposed on opposing surfaces of the first encapsulant, the first wiring layer connected to the first wiring pattern and the first contact through first wiring vias in an upper portion of the first encapsulant, and the second wiring layer connected to the second wiring pattern and the second contact through second wiring vias in a lower portion of the first encapsulant;
a connection structure, on which the first wiring is disposed, including a redistribution layer;
a chip component disposed in a through-hole penetrating portions of the first encapsulant and the frame and having a connection terminal, the chip component disposed on the connection structure; and
a second encapsulant disposed on the upper portion of the first encapsulant and filling the through-hole,
wherein the redistribution layer is connected to the first wiring layer and the connection terminal, and
the chip component includes at least one of a chip antenna and a second semiconductor chip.

17. The semiconductor package of claim 16, further comprising a rear redistribution pattern disposed on the second encapsulant and connected to the first wiring layer through a rear via in the second encapsulant.

18. The semiconductor package of claim 16, wherein the chip component is in contact with an insulating layer of the connection structure, and the first semiconductor chip is spaced apart from the insulating layer of the connection structure.

19. The semiconductor package of claim 16, wherein the first semiconductor chip includes a power device chip,
at least one of the second wiring pattern or the redistribution layer includes a frequency filter unit.

* * * * *